(12) United States Patent
Chang

(10) Patent No.: US 6,897,696 B2
(45) Date of Patent: May 24, 2005

(54) DUTY-CYCLE ADJUSTABLE BUFFER AND METHOD AND METHOD FOR OPERATING SAME

(75) Inventor: Chi Chang, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/652,056

(22) Filed: Aug. 29, 2003

(65) Prior Publication Data

US 2004/0150447 A1 Aug. 5, 2004

(30) Foreign Application Priority Data

Oct. 2, 2002 (TW) ........................................ 91122773 A

(51) Int. Cl.[7] .............................................. H03K 3/017
(52) U.S. Cl. ....................................... 327/175; 327/263
(58) Field of Search ................................ 327/153, 161, 327/172–175, 261–264, 276–278, 281, 284–285, 288

(56) References Cited

U.S. PATENT DOCUMENTS 5,111,085 A * 5/1992 Stewart ....................... 327/278
5,790,612 A * 8/1998 Chengson et al. .......... 375/373
6,069,508 A   5/2000 Takai
6,404,258 B2 * 6/2002 Ooishi ......................... 327/278

* cited by examiner

Primary Examiner—My-Trang Nu Ton
(74) Attorney, Agent, or Firm—Madson & Metcalf

(57) ABSTRACT

A duty-cycle adjustable buffer and a method for operating such buffer can be applied to a clock tree circuit for providing an adjustable duty cycle. The duty-cycle adjustable buffer includes a first inverter and a second inverter connected with each other in series. Each of the first inverter and the second inverter includes a plurality of controlled current charging paths and a plurality of controlled current discharging paths, wherein at least one controlled current charging path and at least one controlled current discharging path of the first inverter and the second inverter are conducted. The timing of the rising edge and falling edge of a clock signal is dynamically adjusted so as to dynamically altering the duty cycle of the clock signal.

21 Claims, 6 Drawing Sheets

DUTY-CYCLE ADJUSTABLE BUFFER AND METHOD AND METHOD FOR OPERATING SAME

FIELD OF THE INVENTION

The present invention relates to a buffer and its operating method, and more particularly to a buffer for use in a clock tree circuit to control a duty cycle of a clock signal and a method for operating such buffer.

BACKGROUND OF THE INVENTION

Generally, clock signals with one or more frequencies are required for many recent integrated circuits. The timing and processing speed of an integrated circuit can be realized according to the clock signals to be used. The operating speed of the circuit system is increased as the frequencies of clock signals thereof increase. Thus, the quality of a clock signal is very important for the circuit system. If the quality of a clock signal is not well maintained, the operating speed of the circuit system may not be increased, or even the whole circuit system fails to operate.

When the quality of clock signals of the circuit system is taken into consideration, in addition to their accuracy, more attention should be paid to the duty cycles thereof. An ideal clock signal 100 shown in FIG. 1 has a duty cycle of 50%. That is to say, this ideal clock signal has alternate high level and low level, and the time spans of the high level and low level are equal.

With increasing development, the circuitries of integrated circuits become more and more complicated. Furthermore, the clock signals used in the integrated circuits must be distributed into a plurality of branches for being transmitted to desired parts of the integrated circuit system so as to be the timing basis for operating the circuit system. However, once the plurality of clock signals are divided side-by-side, the energy of each clock signal is equally divided, and the reduced energy might not be sufficient to drive subsequent sectional circuits. In order to solve the problem, a clock tree circuit having a plurality of buffers 205 shown in FIG. 2 was incorporated into the circuit system so as to enhance the fan-out capability of the clock signals.

FIG. 3 is a schematic circuit block diagram illustrating a buffer applied in a conventional clock tree circuit. The buffer comprises two inverters 300. Each inverter 300 comprises a PMOS transistor 305 and an NMOS transistor 310. The PMOS transistor 305 has a source terminal connected to an applied voltage 315 and a drain terminal connected to the drain terminal of the NMOS transistor 310 so as to form a common output end 330 of this inverter 300. The NMOS transistor 310 has a source terminal connected to a grounding level 320. The gate terminals of the PMOS transistor 305 and the NMOS transistor 310 are connected with each other so as to form a common input end 325 of the inverter 300. If the logic value inputted into this inverter 300 is "1", the PMOS transistor 305 suspends operations but the NMOS transistor 310 operates. As a result, a logic value "0" is generated and outputted through the output end 330. On the contrary, if the logic value inputted into this inverter 300 is "0", a logic value "1" is generated and outputted through the output end 330.

As also shown in FIG. 3, these two inverters 300 are connected with each other in series to form a buffer. If a logic value "1" is inputted into the buffer via the input end 325, a logic value "1" is generated and outputted through the output end 335. Whereas, if a logic value "0" is inputted into the buffer via the input end 325, a logic value "0" is generated and outputted through the output end 335. Furthermore, the energy provided by the inverters 300 can be used to enhance the fan-out capability of the clock tree circuit, and thus clock signals will have sufficient energy to drive the next-stage buffers.

Due to the above reasons, the clock signals used in the integrated circuits must be distributed into a plurality of branches by using a plurality of buffers 205 to form the clock tree circuit in FIG. 2. In practice, each buffer 205 has a circuit configuration as that shown in FIG. 3, i.e. a complementary metal-oxide-semiconductor (CMOS) transistor. Due to different electrical properties and different sizes between the PMOS transistor and the NMOS transistor of the CMOS transistor, and parasitic capacitance caused by the clock tree circuit itself and other effects, when an ideal clock signal 200 having a duty cycle of 50% (as shown in FIG. 2) is repeatedly divided, the output clock signal might be somewhat distorted. For example, as can be seen in FIGS. 4(*a*) and 4(*b*), either a clock signal 405 with a duty cycle greater than 50% or a clock signal 410 with a duty cycle less than 50% is outputted.

That is to say, the quality of the clock signals might be impaired after the clock signals are repeatedly divided by the clock tree circuit. Therefore, the operating speed of the circuit system may not be increased, or even the whole circuit system fails to operate.

SUMMARY OF THE INVENTION

The present invention provides a duty-cycle adjustable buffer. The duty-cycle adjustable buffer comprises a first inverter and a second inverter connected with each other in series. Each of the first inverter and the second inverter comprises a plurality of controlled current charging paths and a plurality of controlled current discharging paths, wherein at least one controlled current charging path and at least one controlled current discharging path of the first inverter are conducted.

The present invention provides a duty-cycle adjustable buffer. The duty-cycle adjustable buffer comprises a first inverter and a second inverter connected with each other in series. The first inverter is electrically connected to a source voltage and a grounding voltage via a first PMOS transistor group and a first NMOS transistor group, respectively. The second inverter is electrically connected to the source voltage and the grounding voltage via a second PMOS transistor group and a second NMOS transistor group, respectively.

The present invention provides a method for adjusting duty cycle of clock signals used in a first and a second inverters connected with each other in series, where each of the first and the second inverters comprises a plurality of current charging paths and a plurality of current discharging paths. When it is requested to reduce the duty cycle of at least one clock signal, the number of current charging paths of the first inverter in the operating states is selectively increased and the number of current discharging paths of the second inverter in the operating states is selectively increased. When it is requested to increase the duty cycle of at least one clock signal, the number of current discharging paths of the first inverter in the operating states is selectively increased and the number of current charging paths of the second inverter in the operating states is selectively increased.

The present invention provides a method for adjusting duty cycle of clock signals used in a first and a second inverters connected with each other in series, where each of the first and the second inverters comprises a plurality of current charging paths and a plurality of current discharging paths. When it is requested to reduce the duty cycle of at least one clock signal, the number of current discharging paths of the first inverter in the operating states is selectively decreased and the number of current charging paths of the second inverter in the operating states is selectively decreased. When it is requested to increase the duty cycle of at least one clock signal, the number of current charging paths of the first inverter in the operating states is selectively decreased and the number of current discharging paths of the second inverter in the operating states is selectively decreased.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

As previously described, the conventional buffer has the problem of lowering quality of clock signals, resulting in a distorted clock signal with a duty cycle greater or less than 50%. Therefore, the present invention provides a duty-cycle adjustable buffer and its operating method to be used in a clock tree circuit. By means of the buffer and the method of the present invention, the duty cycle of the inputted clock signal is identical to that of the clock signal outputted from the clock tree circuit. Furthermore, the voltage level of the clock signal can be appropriately maintained so as to provide sufficient energy to drive the next-stage buffers.

Figure 5:
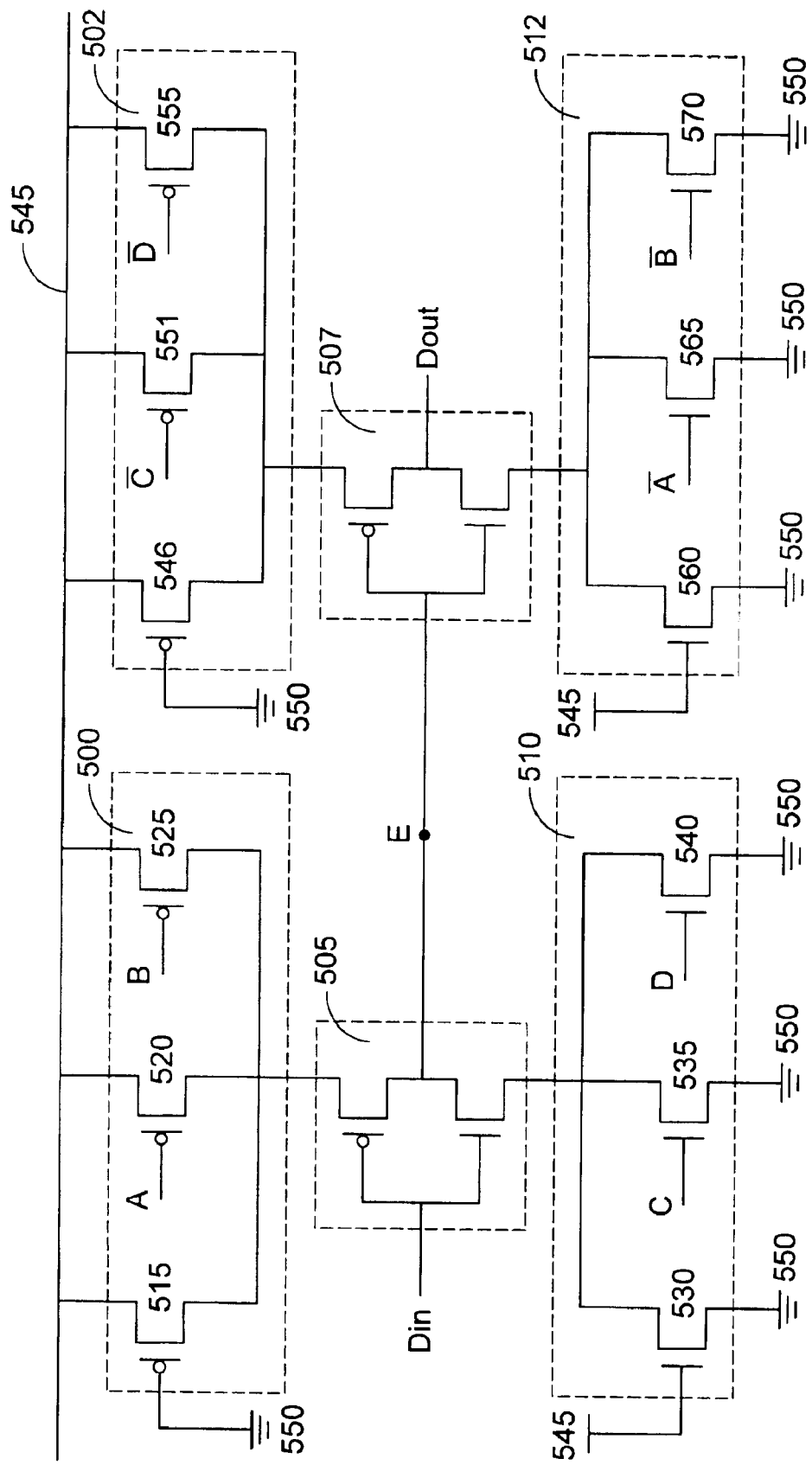
FIG. 5 is a schematic circuit diagram illustrating a programmable duty-cycle adjustable buffer according to a preferred embodiment of the present invention.

An embodiment of the present invention will be described in more details with reference to FIG. 5. The duty-cycle adjustable buffer shown in FIG. 5 is implemented by a pair of programmable inverters 505 and 507 connected with each other in series, a first PMOS transistor group 500, a second PMOS transistor group 502, a first NMOS transistor group 510 and a second NMOS transistor group 512.

The first PMOS transistor group 500 comprises a first PMOS transistor 515, a second PMOS transistor 520 and a third PMOS transistor 525. The gate terminal of the first PMOS transistor 515 is grounded. The gate terminals of the second PMOS transistor 520 and the third PMOS transistor 525 are used as control terminals for inputting control signals A and B thereto, respectively. The second PMOS transistor group 502 comprises a fourth PMOS transistor 546, a fifth PMOS transistor 551 and a sixth PMOS transistor 555. The gate terminal of the fourth PMOS transistor 546 is grounded. The gate terminals of the fifth PMOS transistor 551 and the sixth PMOS transistor 555 are used as control terminals for inputting control signals $\overline{C}$ and $\overline{D}$ thereto, respectively.

The first inverter 505 is connected to the drain terminals of the PMOS transistors 515, 520 and 525 in parallel, and the source terminals of the PMOS transistors 515, 520 and 525 are connected to a source voltage 545. Since the first PMOS transistor 515 needs to be kept in an operating state, the gate terminal of the first PMOS transistor 515 is connected to a grounding voltage 550. In a preferred embodiment of the present invention, the channel width of the second PMOS transistor 520 is greater than that of the third PMOS transistor 525.

The first NMOS transistor group 510 comprises a first NMOS transistor 530, a second NMOS transistor 535 and a third NMOS transistor 540. The gate terminal of the first NMOS transistor 530 is connected to the source voltage 545. The gate terminals of the second NMOS transistor 535 and the third NMOS transistor 540 are used as control terminals for inputting control signals C and D thereto, respectively. The second NMOS transistor group 512 comprises a fourth NMOS transistor 560, a fifth NMOS transistor 565 and a sixth NMOS transistor 570. The gate terminal of the fourth NMOS transistor 560 is connected to the source voltage 545. The gate terminals of the fifth NMOS transistor 565 and the sixth NMOS transistor 570 are used as control terminals for inputting control signals $\overline{A}$ and $\overline{B}$ thereto, respectively.

The output end E of the first inverter 505 is connected to the input end of the second inverter 507, i.e. to the gate terminals of the PMOS transistor and the NMOS transistor of the second inverter 507. The second inverter 507 is connected to the drain terminals of the PMOS transistor 546, 551 and 555 in parallel, and the source terminals of the PMOS transistor 546, 551 and 555 are connected to the source voltage 545. The gate terminal of the fourth PMOS transistor 546 is connected to a grounding voltage 550. The gate terminal of the fifth PMOS transistor 551 is used for inputting the control signal $\overline{C}$ thereto. The gate terminal of the sixth PMOS transistor 555 is used for inputting the control signal $\overline{D}$ thereto.

The drain terminals and the source terminals of the fourth NMOS transistor 560, the fifth NMOS transistor 565 and the sixth NMOS transistor 570 are connected to the NMOS transistor of the second inverter 507 and the grounding voltage 550, respectively. The gate terminal of the fourth NMOS transistor 560 is connected to the source voltage 545. The gate terminal of the fifth NMOS transistor 565 is used for inputting the control signal $\overline{A}$ thereto. The gate terminal of the sixth NMOS transistor 570 is used for inputting the control signal $\overline{B}$ thereto. In the second inverter 507, the drain terminals of the PMOS transistor and the NMOS transistor are connected to each other so as to form a common output end Dout of the second inverter 507.

By means of the circuit of FIG. 5, each of the second PMOS transistor 520, the third PMOS transistor 525, the fifth PMOS transistor 551, the sixth PMOS transistor 555, the second NMOS transistor 535, the third NMOS transistor 540, the fifth NMOS transistor 565 and the sixth NMOS transistor 570 can be switched in either a switching-on or a switching-off state by changing the control signals A, B, C, D, $\overline{A}$, $\overline{B}$, $\overline{C}$ and $\overline{D}$. The rising-edge charging period or the falling-edge discharging period of the programmable duty-cycle adjustable inverter can be adjusted accordingly.

As described above, the signals $\overline{A}$, $\overline{B}$, $\overline{C}$ and $\overline{D}$ are complements of the control signals A, B, C and D, respectively.

The first inverter 505 is connected to the drain terminals of the NMOS transistors 530, 535 and 540 in parallel, and the source terminals of the NMOS transistors 530, 535 and 540 are connected to the grounding voltage 550. Since the first NMOS transistor 530 needs to be kept in an operating state, the gate terminal of the first NMOS transistor 530 is connected to the source voltage 545. In a preferred embodiment of the present invention, the channel width of the second NMOS transistor 535 is greater than that of the third NMOS transistor 540.

If a rising-edge signal indicating the level changing from "0" to "1" is inputted via the input end Din of the first inverter 505, a falling-edge signal indicating the level changing from "1" to "0" is generated from the output end E of the first inverter 505. At the time, a discharging operation is done at the output end E of the first inverter 505. In order to perform such discharging operation, the first NMOS transistor 530 should keep in a switching-on state. If the second NMOS transistor 535 and/or the third NMOS transistor 540 are also switched on, the total discharging current will be increased so as to shorten the discharging period. Since the channel width of the second NMOS transistor 535 is greater than that of the third NMOS transistor 540, the discharging periods can be somewhat distinguished. In a case that both the second NMOS transistor 535 and the third NMOS transistor 540 are not switched on, the discharging period is the longest. If the second NMOS transistor 535 is switched off but the third NMOS transistor 540 is switched on, the discharging period is somewhat shorter. If the second NMOS transistor 535 is switched on but the third NMOS transistor 540 is switched off, the discharging period is further shorter. In a case that both the second NMOS transistor 535 and the third NMOS transistor 540 are switched on, the discharging period is the shortest.

If a falling-edge signal indicating the level changing from "1" to "0" is inputted via the input end Din of the first inverter 505, a rising-edge signal indicating the level changing from "0" to "1" is generated from the output end E of the first inverter 505. At the time, a charging operation is done at the output end E of the first inverter 505. In order to perform such charging operation, the first PMOS transistor 515 should keep in a switching-on state. If the second PMOS transistor 520 and/or the third PMOS transistor 525 are also switched on, the total charging current will be increased so as to shorten the charging period. Since the channel width of the second PMOS transistor 520 is greater than that of the third PMOS transistor 525, the charging periods can be somewhat distinguished. In a case that both the second PMOS transistor 520 and the third PMOS transistor 525 are not switched on, the charging period is the longest. If the second PMOS transistor 520 is switched off but the third PMOS transistor 525 is switched on, the charging period is somewhat shorter. If the second PMOS transistor 520 is switched on but the third PMOS transistor 525 is switched off, the charging period is further shorter. In a case that both the second PMOS transistor 520 and the third PMOS transistor 525 are switched on, the charging period is the shortest.

If a signal "1" is inputted via the input end Din of the first inverter 505, a signal "0" is generated from the output end E of the first inverter 505. At the time when the NMOS transistor of the first inverter 505 is switched on, the first NMOS transistor group 510 will keep in a switching-on state, thereby shortening the time period required for current reaching the grounding portion 550. Since the gate terminal of the first NMOS transistor 530 is connected to the source voltage 545 and kept in a switching-on state, the enable control signals C or D will keep the second NMOS transistor 535 or the third NMOS transistor 540 in a switching-on state so as to further reduce the time period for current passing from the first NMOS transistor group 510 to the grounding voltage 550.

If a signal "0" is inputted via the input end Din of the first inverter 505, a signal "1" is generated from the output end E of the first inverter 505. At the time when the PMOS transistor of the first inverter 505 is switched on, the first PMOS transistor group 500 will keep in a switching-on state, thereby shortening the time period for voltage in the output end E changing from a low level to a high level. Since the gate terminal of the first PMOS transistor 515 is connected to the grounding voltage 550 and kept in a switching-on state, the enable control signal A or B will keep the second PMOS transistor 520 or the third PMOS transistor 525 in a switching-on state so as to further reduce the time period for voltage at the output end E changing from a low level to a high level.

If a signal "0" is outputted from the output end E of the first inverter 505, a signal "1" is generated from the output end Dout of the second inverter 507. At the time, the second PMOS transistor group 502 will keep in a switching-on state, thereby shortening the time period for voltage in the output end Dout changing from a low level to a high level. If the control signals $\overline{C}$ or $\overline{D}$ is at a low level, the fifth PMOS transistor 551 or the sixth PMOS transistor 555 will be kept in a switching-on state so as to further reduce the time period for voltage at the output end Dout changing from a low level to a high level.

If a signal "1" is outputted from the output end E of the first inverter 505, a signal "0" is generated from the output end Dout of the second inverter 507. At the time, the second NMOS transistor group 512 will keep in a switching-on state, thereby shortening the time period for voltage at the output end Dout changing from a high level to a low level. If the control signals $\overline{A}$ or $\overline{B}$ is at a high level, the fifth NMOS transistor 565 or the sixth NMOS transistor 570 will be kept in a switching-on state so as to further reduce the time period for voltage at the output end Dout changing from a high level to a low level.

Since the signals $\overline{A}$, $\overline{B}$, $\overline{C}$ and $\overline{D}$ are complements of the control signals A, B, C and D, respectively, if a signal "1" is inputted via the input end Din of the first inverter 505, the first NMOS transistor group 510 will shorten the low-level delay time of the clock signal at the output end E of the first inverter 505. In addition, the second PMOS transistor group 502 will shorten the high-level delay time of the clock signal at the output end Dout of the second inverter 507. If a signal "0" is inputted via the input end Din of the first inverter 505, the first PMOS transistor group 500 will shorten the high-level delay time of the clock signal at the output end E of the first inverter 505, and the second NMOS transistor group 512 will shorten the low-level delay time of the clock signal in the output end Dout of the second inverter 507.

Figure 1:
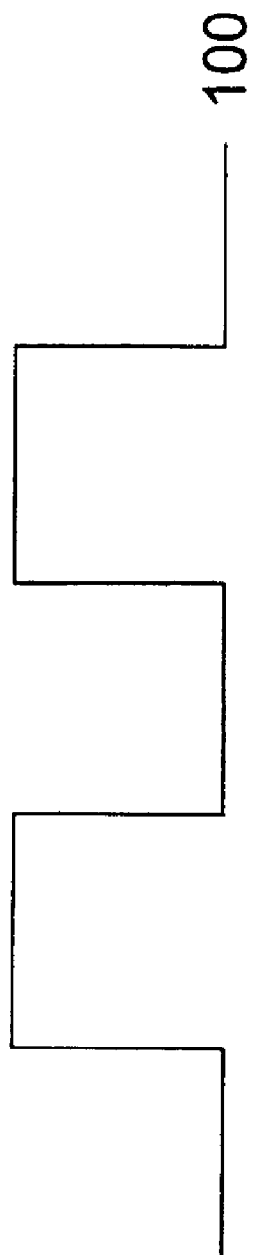
FIG. 1 is a timing waveform diagram showing an ideal clock signal having a duty cycle of 50%.
Figure 2:
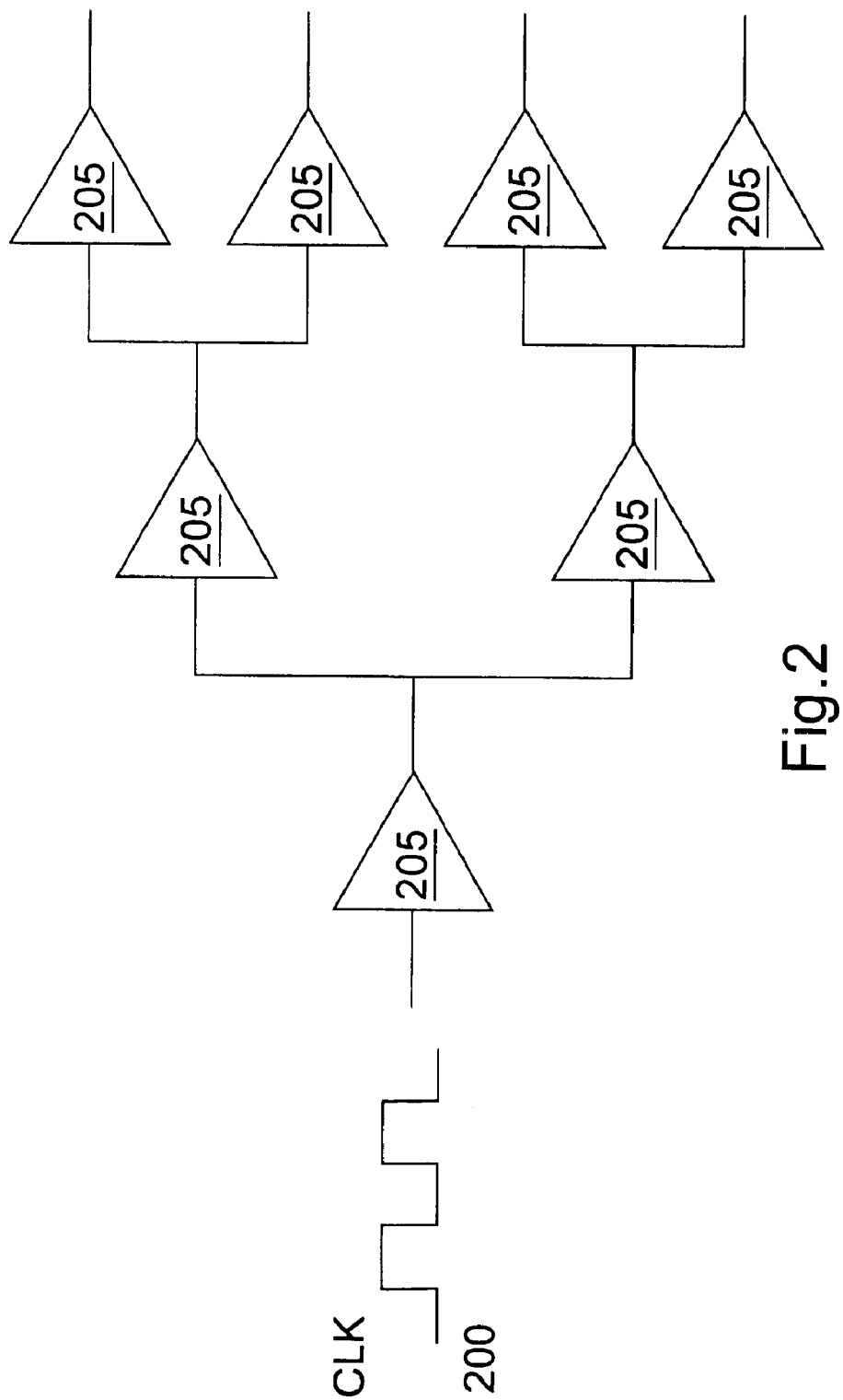
FIG. 2 schematically illustrates a clock tree circuit.
Figure 3:
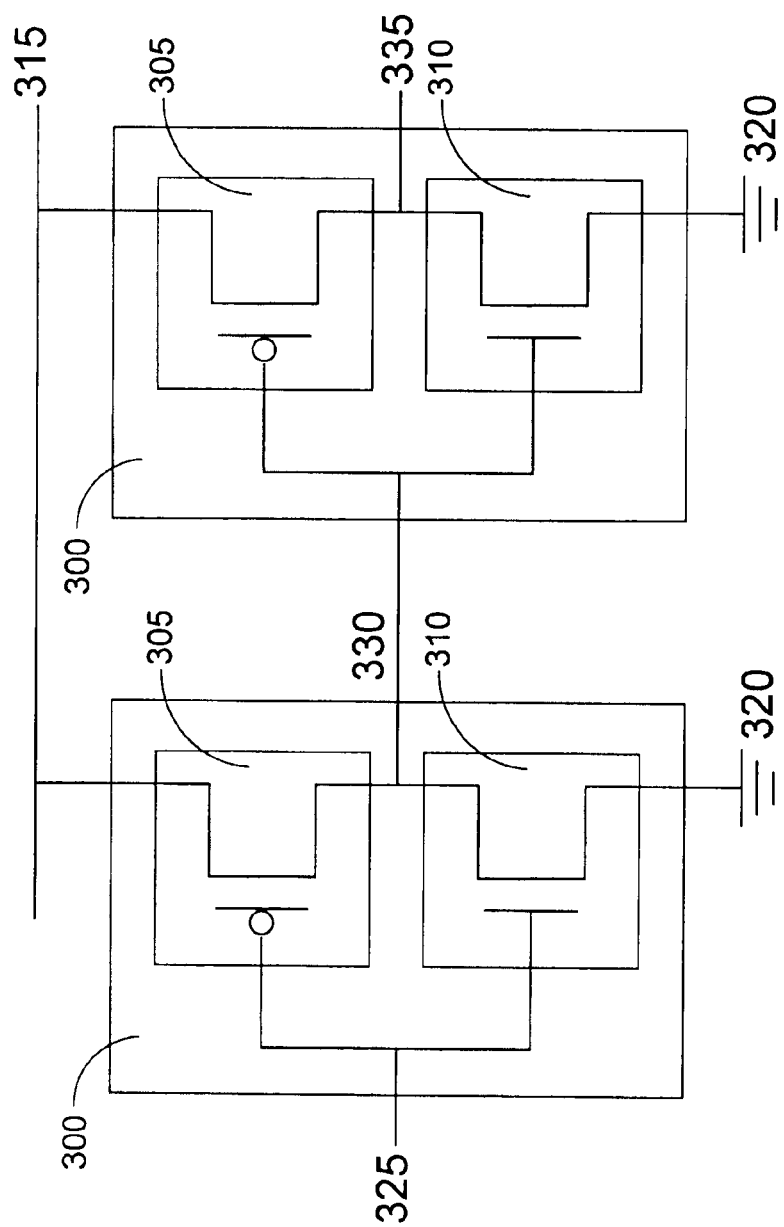
FIG. 3 is a schematic circuit diagram illustrating a conventional buffer.
Figure 4A:
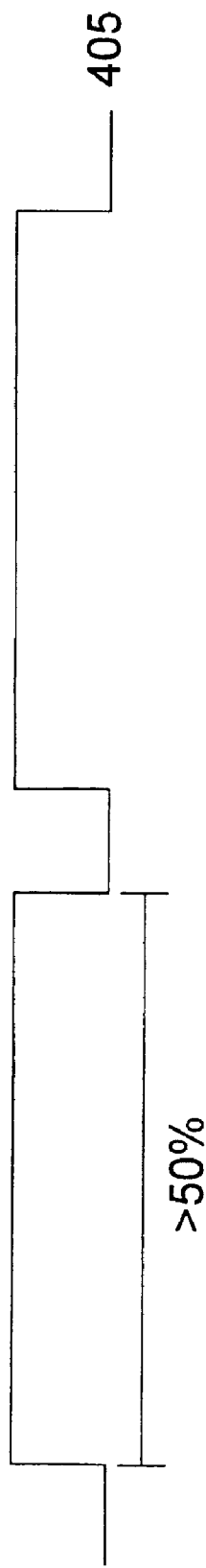
FIGS. 4(a) and 4(b) are timing waveform diagrams showing two clock signals respectively having a duty cycle of greater and less than 50%.
Figure 6:
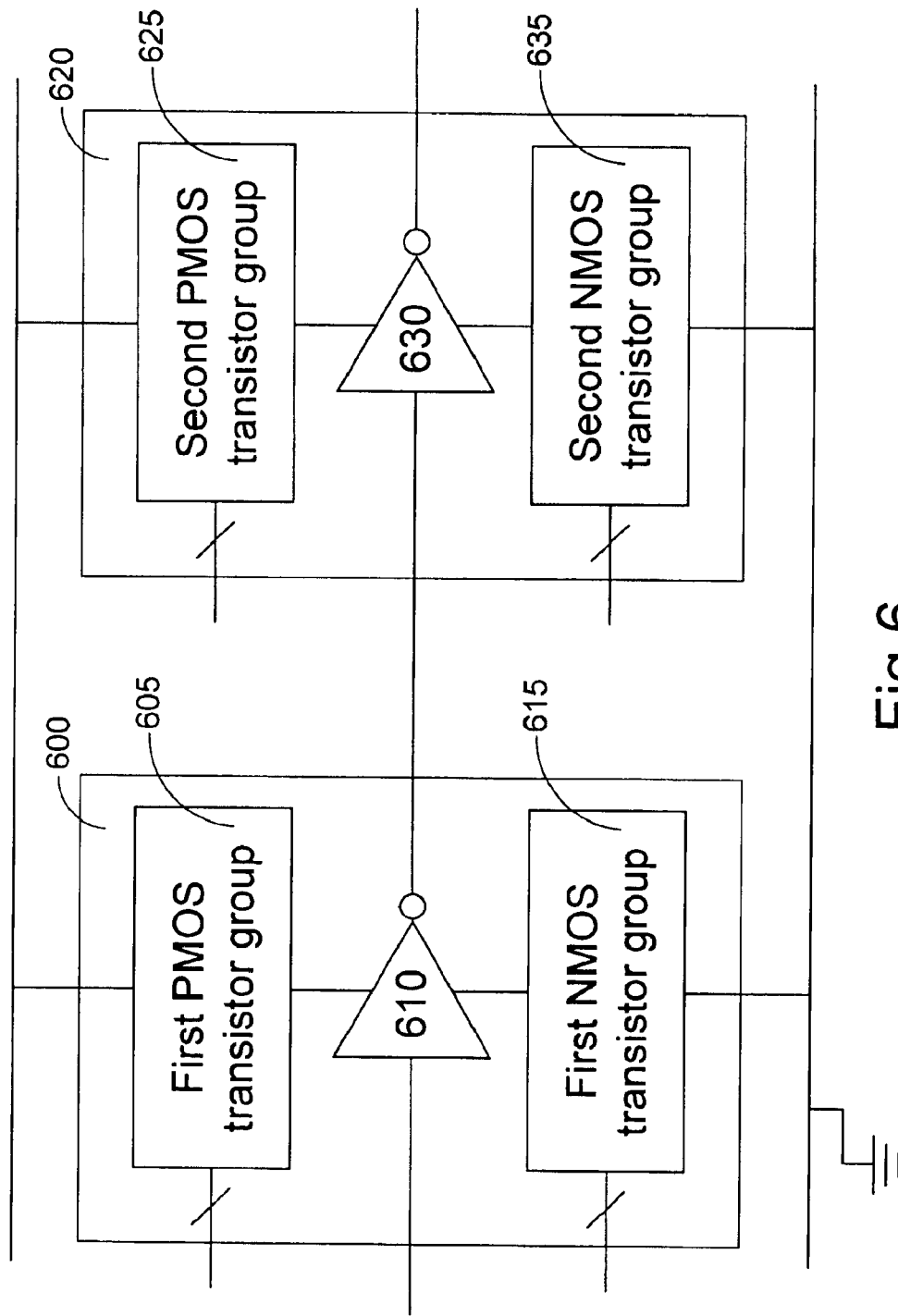
FIG. 6 is a schematic circuit diagram illustrating a programmable duty-cycle adjustable buffer according to another preferred embodiment of the present invention.

Another embodiment of the present invention will be described in more details with reference to FIG. 6. The duty-cycle adjustable buffer shown in FIG. 6 is implemented by a first programmable inverter 600 and a second programmable inverter 620 connected to each other in series. Take the clock signal 405 with a duty cycle greater than 50%, as shown in FIG. 4(a), inputted into the first programmable inverter 600 as an example. For a purpose of adjusting the duty cycle to almost 50%, it is necessary to shorten the charging period but increase the discharging period for the first programmable inverter 600, however, it is necessary to increase the charging period but shorten the discharging period for the second programmable inverter 620. Therefore, some field effect transistors of the first PMOS transistor group 605 and the second NMOS transistor group 635 can be suitably operated, but some of the first NMOS transistor group 615 and the second PMOS transistor group 625 suspend operations suitably.

Figure 4B:
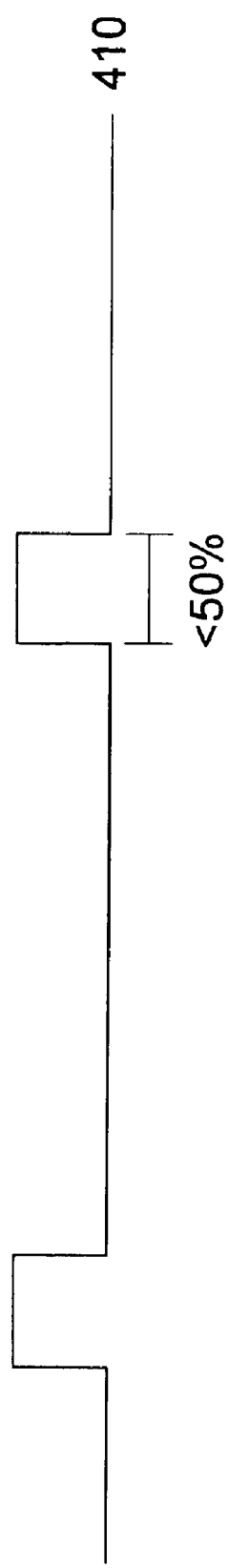

Take the clock signal 410 with a duty cycle less than 50%, as shown in FIG. 4(b), inputted into the first programmable inverter 600 as an example. Likewise, for a purpose of adjusting the duty cycle to almost 50%, it is necessary to increase the charging period but shorten the discharging period for the first programmable inverter 600, however, it is necessary to shorten the charging period but increase the discharging period for the second programmable inverter 620. Therefore, some field effect transistors of the first PMOS transistor group 605 and the second NMOS transistor group 635 can suspend operations, but some of the first NMOS transistor group 615 and the second PMOS transistor group 625 can be operated appropriately.

From the above description, it is understood that the duty cycle of the clock signal processed by the clock tree circuit according to the present invention can be effectively maintained at 50% so as to increase signal quality.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A duty-cycle adjustable buffer comprising:
   a first inverter comprising a plurality of first controlled current charging paths and a plurality of first controlled current discharging paths, wherein at least one of said first controlled current charging path and at least one of said first controlled current discharging path of said first inverter are conducted; and
   a second inverter electrically connected with said first inverter in series, and comprising a plurality of second controlled current charging paths and a plurality of second controlled current discharging paths, wherein at least one of said second controlled current charging path and at least one of said second controlled current discharging path of said second inverter are conducted;
   wherein at least one of said first controlled current charging paths and at least one of said second controlled current discharging paths are controlled with a pair of correlative control signals, respectively.

2. The duty-cycle adjustable buffer according to claim 1 wherein said controlled current charging paths comprise a plurality of PMOS transistors connected with each other in parallel, and each of said plurality of PMOS transistors is controlled in either a switching-on or a switching-off state via the gate terminals thereof.

3. The duty-cycle adjustable buffer according to claim 2 wherein said controlled current discharging paths comprise a plurality of NMOS transistors connected with each other in parallel, and each of said plurality of NMOS transistors is controlled in either a switching-on or a switching-off state via the gate terminals thereof.

4. The duty-cycle adjustable buffer according to claim 3 wherein at least one of said first controlled current discharging paths and at least one of said second controlled current charging paths are controlled with another pair of correlative control signals, respectively.

5. The duty-cycle adjustable buffer according to claim 4 wherein said first controlled current discharging paths and said second controlled current charging paths controlled with said another correlative control signals are conducted synchronously.

6. The duty-cycle adjustable buffer according to claim 5 wherein said another pair of correlative control signals are a pair of complementary signals inputted into the gate terminal of one of said NMOS transistors of said first controlled current discharging paths and the gate terminal of one of said PMOS transistors of said second controlled current charging paths.

7. The duty-cycle adjustable buffer according to claim 3 wherein said pair of correlative control signals are a pair of complementary signals inputted into the gate terminal of one of said PMOS transistors of said first controlled current charging paths and the gate terminal of one of said NMOS transistors of said second controlled current discharging paths.

8. The duty-cycle adjustable buffer according to claim 1 wherein said first controlled current charging paths and said second controlled current discharging paths controlled with said correlative control signals are conducted synchronously.

9. A duty-cycle adjustable buffer comprising:
   a first inverter electrically connected to a source voltage and a grounding voltage via a first PMOS transistor group and a first NMOS transistor group, respectively; and
   a second inverter electrically connected with said first inverter in series, said second inverter being electrically connected to said source voltage and said grounding voltage via a second PMOS transistor group and a second NMOS transistor group, respectively;
   wherein said first PMOS transistor group and said second PMOS transistor group are controlled with two independent control signals, respectively.

10. The duty-cycle adjustable buffer according to claim 9 wherein said first NMOS transistor group and said second NMOS transistor group are controlled with two independent control signals, respectively.

11. The duty-cycle adjustable buffer according to claim 10 wherein each of said first PMOS transistor group and said second PMOS transistor group comprises a plurality of PMOS transistors connected with each other in parallel, and each of said plurality of PMOS transistors is controlled in either a switching-on or a switching-off state via the gate terminals thereof.

12. The duty-cycle adjustable buffer according to claim 11 wherein each of said first NMOS transistor group and said second NMOS transistor group comprises a plurality of NMOS transistors connected with each other in parallel, and each of said plurality of NMOS transistors is controlled in either a switching-on or a switching-off state via the gate terminals thereof.

13. The duty-cycle adjustable buffer according to claim 12 wherein the gate terminal of one of said PMOS transistors of said first PMOS transistor group and the gate terminal of one of said NMOS transistors of said second NMOS transistor group are coupled to a pair of complementary signals, respectively; and the gate terminal of one of said NMOS transistors of said first NMOS transistor group and the gate terminal of one of said PMOS transistors of said second PMOS transistor group are coupled to another pair of complementary signals, respectively.

14. A method for adjusting duty cycle of clock signals used in a first and a second inverters connected with each other in series, each of said first and said second inverters comprising a plurality of current charging paths and a plurality of current discharging paths, said method comprising steps of:

reducing said duty cycle of at least one clock signal by selectively increasing the number of current charging paths of said first inverter in operating states and selectively increasing the number of current discharging paths of said second inverter in operating states, or selectively decreasing the number of current discharging paths of said first inverter in operating states and selectively decreasing the number of current charging paths of said second inverter in operating states in a first situation; and increasing said duty cycle of at least one clock signal by selectively increasing the number of current discharging paths of said first inverter in operating states and selectively increasing the number of current charging paths of said second inverter in operating states, or selectively decreasing the number of current charging paths of said first inverter in operating states and selectively decreasing the number of current discharging oaths of said second inverter in operating states in a second situation.

15. The method according to claim 14 wherein said duty cycle of said clock signals is reduced from greater than 50% to 50% in said first situation.

16. The method according to claim 14 wherein said duty cycle of said clock signals is increased from less than 50% to 50% in said second situation.

17. A duty-cycle adjustable buffer comprising:

a first inverter electrically connected to a source voltage and a grounding voltage via a first PMOS transistor group and a first NMOS transistor group, respectively; and a second inverter electrically connected with said first inverter in series, said second inverter being electrically connected to said source voltage and said grounding voltage via a second PMOS transistor group and a second NMOS transistor group, respectively;

wherein said first NMOS transistor group and said second NMOS transistor group are controlled with two independent control signals, respectively.

18. The duty-cycle adjustable buffer according to claim 17 wherein said first PMOS transistor group and said second PMOS transistor group are controlled with two independent control signals, respectively.

19. The duty-cycle adjustable buffer according to claim 18 wherein each of said first NMOS transistor group and said second NMOS transistor group comprises a plurality of NMOS transistors connected with each other in parallel, and each of said plurality of NMOS transistors is controlled in either a switching-on or a switching-off state via the gate terminals thereof.

20. The duty-cycle adjustable buffer according to claim 19 wherein each of said first PMOS transistor group and said second PMOS transistor group comprises a plurality of PMOS transistors connected with each other in parallel, and each of said plurality of PMOS transistors is controlled in either a switching-on or a switching-off state via the gate terminals thereof.

21. The duty-cycle adjustable buffer according to claim 20 wherein the gate terminal of one of said PMOS transistors of said first PMOS transistor group and the gate terminal of one of said NMOS transistors of said second NMOS transistor group are coupled to a pair of complementary signals, respectively; and the gate terminal of one of said NMOS transistors of said first NMOS transistor group and the gate terminal of one of said PMOS transistors of said second PMOS transistor group are coupled to another pair of complementary signals, respectively.

* * * * *